United States Patent
Liu et al.

(10) Patent No.: US 10,372,865 B2
(45) Date of Patent: Aug. 6, 2019

(54) SYSTEM DESIGN BASED ON UNIFIED CHIP SPECIFICATION

(71) Applicant: International Business Machines Corporation, Armonk, NY (US)

(72) Inventors: Yang Liu, Shanghai (CN); Yong Lu, Shanghai (CN); Peng LM Shao, Beijing (CN); Jiang Yu, Shanghai (CN)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 15/356,543

(22) Filed: Nov. 19, 2016

(65) Prior Publication Data

US 2018/0144085 A1    May 24, 2018

(51) Int. Cl.
*G06F 17/50* (2006.01)

(52) U.S. Cl.
CPC .................... *G06F 17/5077* (2013.01)

(58) Field of Classification Search
CPC ............. G06F 17/5027; G06F 17/5081; G06F 17/5077
See application file for complete search history.

(56) References Cited

U.S. PATENT DOCUMENTS

| | | | |
|---|---|---|---|
| 8,069,436 B2 | 11/2011 | Snyder et al. | |
| 8,402,438 B1 | 3/2013 | Andrews et al. | |
| 8,639,487 B1 | 1/2014 | Ezer et al. | |
| 9,880,030 B2 * | 1/2018 | Graf ........................ | G01D 11/00 |
| 2013/0227509 A1 * | 8/2013 | Chang .................. | G06F 17/5081 |
| | | | 716/111 |
| 2014/0173348 A1 | 6/2014 | Engebretsen et al. | |
| 2015/0020050 A1 | 1/2015 | Dain | |
| 2015/0020055 A1 | 1/2015 | Nayak | |

OTHER PUBLICATIONS

Ahn, Sunha, et al., "Automated Firmware Testing Using Firmware-hardware Interaction Patterns"; 2014; <https://web.archive.org/web/20151216030408/http://www.princeton.edu/~sahn/codes2014.pdf>.
University of Kaiserslautern; "Firmware Verification in SoC modules"; <http://www.eit.uni-kl.de/en/eis/research/firmware-verification/>.

* cited by examiner

*Primary Examiner* — Vuthe Siek
(74) *Attorney, Agent, or Firm* — Gilbert Harmon, Jr.

(57) ABSTRACT

Disclosed aspects relate to facilitating system design based on unified chip specification. It can be determined based on the system design that a first interface of a first chip is to be connected to a second interface of a second chip. Then a first configuration of the first interface and a second configuration of the second interface are determined based on a unified specification. The unified specification at least specifies configurations of a plurality of chip interfaces for respective usages. A hardware design may be automatically generated based on the first and second configurations. The hardware design may include a hardware-level connection between the first and second interfaces.

14 Claims, 4 Drawing Sheets

SYSTEM DESIGN BASED ON UNIFIED CHIP SPECIFICATION

BACKGROUND

This disclosure relates generally to computer systems and, more particularly, relates to generating a hardware design for a system based on a set of configurations.

Modern chips such as System-on-Chip (SoC) chips or Application Specific Integrated Circuit (ASIC) chips may have multiple configurations such as physical I/O (Input/Output) configurations and shared different interfaces. The hardware/system designs, however, may only use a few number of usages for each chip under one configuration. In the meantime, in a complex system design hardware design check may need a significant amount of manual effort to find out whether the usage of each chip under each system configuration is correct.

Additionally, firmware design may need to develop/integrate functions according to hardware/system design (chip usage and system configuration), which can be a time-consuming procedure. For example, if a user wants to connect two chips via the respective PCI (Peripheral Component Interface) or PCIe (PCI express) interfaces, the user may need to expressly indicate the connection relationships between pins of the interfaces interfaces and develop firmware code to initialize or otherwise configure the connection. It would be appreciated that manual operations may be likely to introduce errors and overlook some problems in the design.

SUMMARY

In an aspect, a computer-implemented method is provided. The method comprises steps of: determining, based on a system design for a system, that a first interface of a first chip is to be connected to a second interface of a second chip; determining a first configuration of the first interface based on a unified specification, the unified specification at least specifying configurations of a plurality of chip interfaces for respective usages; determining a second configuration of the second interface based on the unified specification; and generating a hardware design for the system based on the first and second configurations, the hardware design including a hardware-level connection between the first and second interfaces.

In another aspect, a device is provided. The device includes a processing unit and a memory coupled to the processing unit and storing instructions thereon, the instructions, when executed by the processing unit, performing operations including: determining, based on a system design for a system, that a first interface of a first chip is to be connected to a second interface of a second chip; determining a first configuration of the first interface based on a unified specification, the unified specification at least specifying configurations of a plurality of chip interfaces for respective usages; determining a second configuration of the second interface based on the unified specification; and generating a hardware design for the system based on the first and second configurations, the hardware design including a hardware-level connection between the first and second interfaces.

In yet another aspect, a computer program product is provided. The computer program product is tangibly stored on a non-transient machine-readable medium and comprising machine-executable instructions, the instructions, when executed on a device, causing the device to: determine, based on a system design for a system, that a first interface of a first chip is to be connected to a second interface of a second chip; determine a first configuration of the first interface based on a unified specification, the unified specification at least specifying configurations of a plurality of chip interfaces for respective usages; determine a second configuration of the second interface based on the unified specification; and generate a hardware design for the system based on the first and second configurations, the hardware design including a hardware-level connection between the first and second interfaces.

The above summary is not intended to describe each illustrated embodiment or every implementation of the present disclosure.

BRIEF DESCRIPTION OF THE SEVERAL VIEWS OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
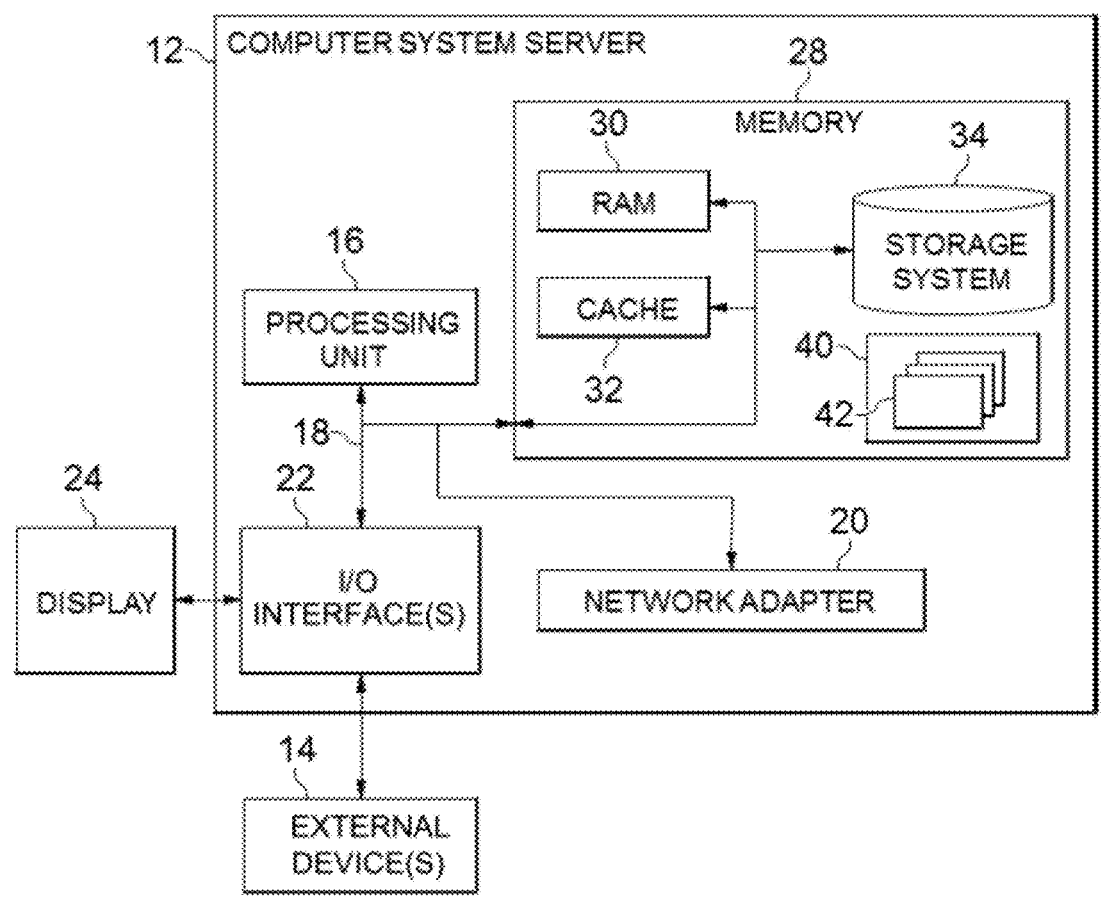
FIG. 1 is a block diagram of an electronic device suitable for implementing embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Principle of the present disclosure will now be described with reference to some example embodiments. It is to be understood that these embodiments are described only for the purpose of illustration and help those skilled in the art to understand and implement the present disclosure, without suggesting any limitations as to the scope of the disclosure. The disclosure described herein can be implemented in various manners other than the ones describe below.

As used herein, the term "includes" and its variants are to be read as open terms that mean "includes, but is not limited to." The term "based on" is to be read as "based at least in part on." The term "one embodiment" and "an embodiment" are to be read as "at least one embodiment." The term "another embodiment" is to be read as "at least one other embodiment." Other definitions, explicit and implicit, may be included below.

Reference is first made to FIG. 1, in which an exemplary electronic device or computer system/server 12 which is applicable to implement the embodiments of the present disclosure is shown. Computer system/server 12 is only illustrative and is not intended to suggest any limitation as to the scope of use or functionality of embodiments of the disclosure described herein.

As shown in FIG. 1, computer system/server 12 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the disclosure.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the disclosure as described herein.

Computer system/server 12 may also communicate with one or more external devices 14 such as a keyboard, a pointing device, a display 24, and the like. One or more devices that enable a user to interact with computer system/server 12; and/or any devices (e.g., network card, modem, etc.) that enable computer system/server 12 to communicate with one or more other computing devices. Such communication can occur via input/output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, and the like.

In computer system/server 12, I/O interfaces 22 may support one or more of various different input devices that can be used to provide input to computer system/server 12. For example, the input device(s) may include a user device such keyboard, keypad, touch pad, trackball, and the like. The input device(s) may implement one or more natural user interface techniques, such as speech recognition, touch and stylus recognition, recognition of gestures in contact with the input device(s) and adjacent to the input device(s), recognition of air gestures, head and eye tracking, voice and speech recognition, sensing user brain activity, and machine intelligence.

Figure 2:
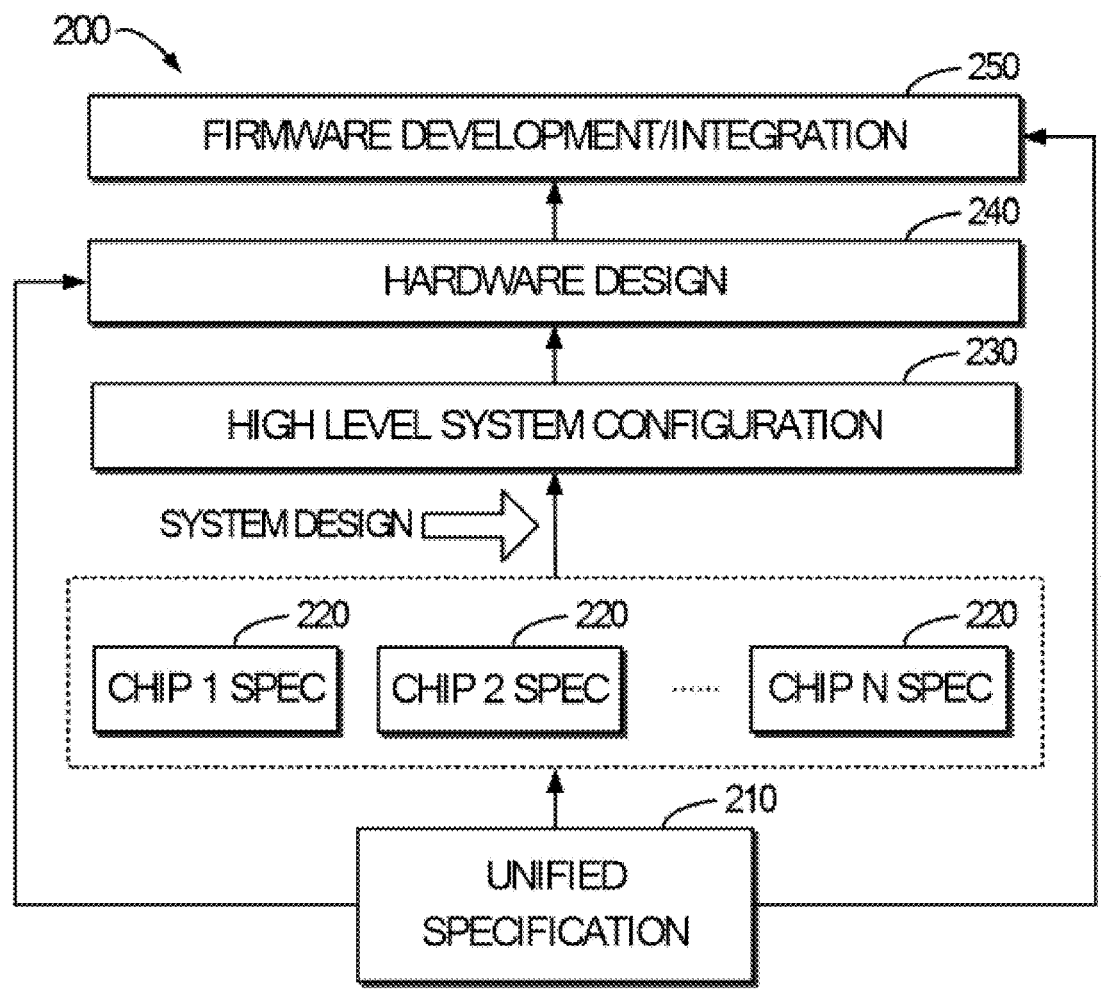
FIG. 2 is a block diagram of an environment in accordance with embodiments of the present disclosure.

Now some example embodiments of the present disclosure will be described. FIG. 2 shows a schematic diagram of an environment 200 for system design. As shown, in accordance with embodiments of the present disclosure, there is a unified specification(s) 210 that serves as basis for the hardware and possibly firmware design for the system. The unified specification 210 may be implemented as one or more documents that record configurations of various types of chips and their respective interfaces. For example, in some embodiments, the unified specification 210 may be generated based on or the usage of chips and/or their sub-modules. For each usage, the specification may at least indicate configurations of interfaces of chips.

For instance, it is known that a chip may have different types of interfaces such as PCI interfaces, PCIe interfaces, I2C interfaces, or the like. For different usages, the interfaces may have different configurations. For example, the pins may be used for different purpose in different situations or connections. For each type of chips, configurations of pins for the respective usages may be determined in advance, for example, by experiments and/or experience. These predetermined configurations are then stored in the unified specification 210. Data in the unified specification 210 may be organized in tables or any other suitable data structures, for example.

The unified specification 210 may record any other information or data that might be used in the system design. For example, in some embodiments, the unified specification 210 may specify combination of registers for each usage of each type of chips. Alternatively, or in addition, in some embodiments, the unified specification 210 may record built-in firmware code for each usage of each type of chips. For example, the built-in firmware code may be used to initialize, configure or otherwise set the registers, interfaces, and/or other sub-modules of chips. In some embodiments, the built-in firmware code may include pseudo code, for example. Alternatively, or in addition, the for each usage of each type of chips, the unified specification 210 may contain one or more drivers and/or one or more application programming interfaces (APIs) to be used by the chips. Examples of information contained in the unified specification will be discussed in the following paragraphs.

In the embodiments as described above, the information contained in the unified specification 210 is organized on the basis of different usages of chips. It is to be understood that the usage-based implementation of the unified specification is just an example without suggesting any limitations as to the scope of the present disclosure. In alternative embodiments, it is possible to generate the unified specification that records configurations of various chips without considering the specific usage.

In some embodiments, the unified specification 210 may be used to model the chips to be used in a system. For example, upon determination of the chips to be used in a system, the interfaces, configurations and/or any other aspects of these chips may be described according to the unified specification 210, thereby obtaining a series of chip specifications 220. In this way, all the chips to be used in the system design can be described in a unified fashion. The chip specifications 220 may be used in the subsequent system design. Of course, it is to be understood that the chip specifications 220 do not necessarily have to be generated. In some embodiments, the subsequent design processes can be performed directly on the basis of the unified specification 210, without expressly generating the chip specification 220.

Given the unified specification 210 and/or the chip specifications 220, a high level system configuration 230 may be generated according to the system design. The high level system design 230 at least specifies the connections of interfaces of the chips. For ease of discussion, it is supposed that according to the system design, a first interface of a first chip is determined to be connected to a second interface of a second chip. Conventionally, a user has to manually generate the hardware-level connections of pins of the first and second interfaces. In accordance with embodiments of the present disclosure, this time consuming and tedious process can be avoided by automatically generating hardware design based on the unified specification 210.

More specifically, given the determination that the first interface of the first chip is to be connected to the second interface of the second chip, the first configuration of the first interface may be obtained from the unified specification 210. In those embodiments where the chip specification 220 for the first chip has been generated based on the unified specification 210, the first configuration of the first interface for the current usage may be retrieved from the chip specification 220. Otherwise, the first configuration of the first interface may be determined from the unified specification 210. A second configuration for the second interface of the second chip may be determined based on the unified specification 210, directly or indirectly, in a similar fashion. By way of example, the first and second configurations may indicate the functions of pins of the first and second interfaces for the current usage, respectively.

Then, a hardware design 240 of the system may be generated automatically. The hardware design 240 includes the hardware-level connections interfaces of chips in the system. Specifically, the hardware design 240 specifies the hardware-level connections between the first and second interfaces. For example, in some embodiments, the hardware design 240 may include a schematic of the system. The schematic includes connections between a first plurality of pins of the first interface and a second plurality of pins of the second interface. That is, the pin connections are automatically determined based on the priori knowledge contained in the unified specification 210, thereby avoiding manual operations.

In some embodiments, the unified specification 210 and/or the chip specifications 220 may be used to perform one or more checks on the hardware design 240. For example, in some embodiments, I/O electrical check may be carried out to verify whether there are any electric conflicts such as pull up/down resister value, I/O operations at different voltages such as 1.8 v and 3.3 v, or the like. Alternatively, or in addition, in some embodiments, the I/O combination check may be performed to determine whether there is any usage conflict on the combination of I/O interfaces. For example, the unified specification 210 and/or the chip specifications 220 may specify that a low pin count (LPC) soft interrupt request (SIRQ) I/O interface can be used only for SIRQ. Accordingly, if it is found that such an I/O interface is used for any other purpose, then a conflict is detected. Any other checks such as strap pin configuration check are possible as well.

In some embodiments, the priori knowledge in the unified specification 210 may be used to perform protocol check on the hardware design 240 to verify whether the generated hardware design conforms to various protocols such as the protocols concerning master/slave, uni-direction or bi-direction bus, open-drain bus, or the like. In some embodiments, the hardware design check may include system usage conflict check based on the unified specification 210. For example, it can be detected whether the memory space is bigger than attached flash capacity.

Still in reference to FIG. 2, in some embodiments, the firmware development/integration 250 may be performed based on the hardware design 240 and the unified specification 210. As described above, in some embodiments, the unified specification 210 includes built-in firmware code for the various chips. In some embodiments, at least a part of the firmware code includes pseudo code, for example. In such embodiments, the built-in firmware may be used to generate system firmware code that initializes or configures the chips or their sub-modules.

For example, in some embodiments, the unified specification 210 may be used to determine a first plurality of registers of the first interface and a second plurality of registers of the second interface. The first plurality of registers and the second plurality of registers are involved in the connection between the first and second chips. The determined registers can be configured by the system firmware code generated based on the unified specification 210. The system firmware code may be generated, for example, by integrating the built-in firmware code included in the unified specification 210 and/or the related chip specifications 220. The integration may include rewriting, instantiation, and/or otherwise adapting of the built-in firmware. The system firmware code is operable to configure the first and/or second chips. For example, the system firmware code may initialize the register values, group registers, and/or map registers of the chips.

In addition to or instead of configuration of registers as discussed above, the system firmware code can be used for various purposes. In some embodiments, the firmware code may generate the initialization sequence for LPC controllers, for example. Moreover, in some embodiments, the firmware may be integrated with other code, for example, the board management controller (BMC) boot code.

In some embodiments, the unified specification 210 may provide needed information or data to be used in the hardware design 240 and the firmware development/integration 250. For example, the unified specification 210 may provide basic information such as clock frequency and base address for the firmware. In addition, or alternatively, the unified specification 210 may provide one or more drivers, one or more APIs, or any information or data needed for the hardware design 240 and the firmware development/integration 250.

Figure 3:
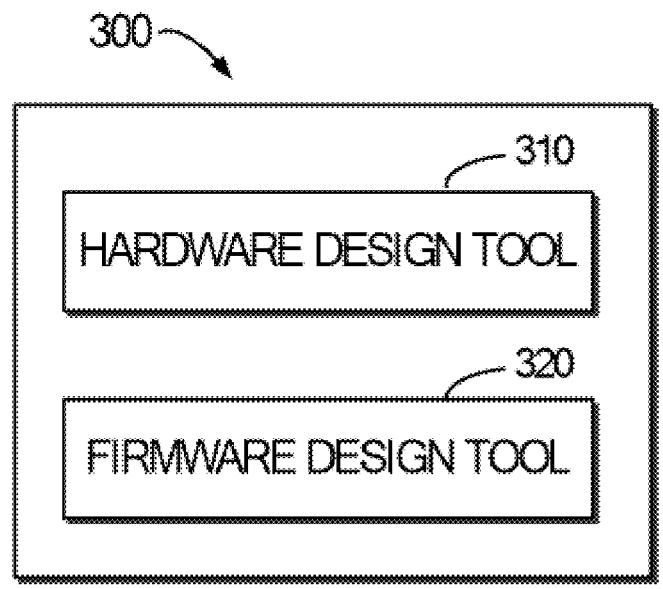
FIG. 3 is a block diagram of a unified platform for system design in accordance with embodiments of the present disclosure.

Embodiments of the present disclosure can be implemented in a variety of ways. For example, a unified design platform 300 may be provided, as shown in FIG. 3. The unified design platform 300 may be implemented by the processing unit 16 of the computer system/server 12, for example. The unified design platform 300 includes a hardware design tool 310 and a firmware design tool 320. In operation, the hardware design tool 310 may generate the hardware design 240 and the firmware design tool 320 may obtain the firmware development/integration 250, both on the basis of the unified specification 210.

Figure 4:
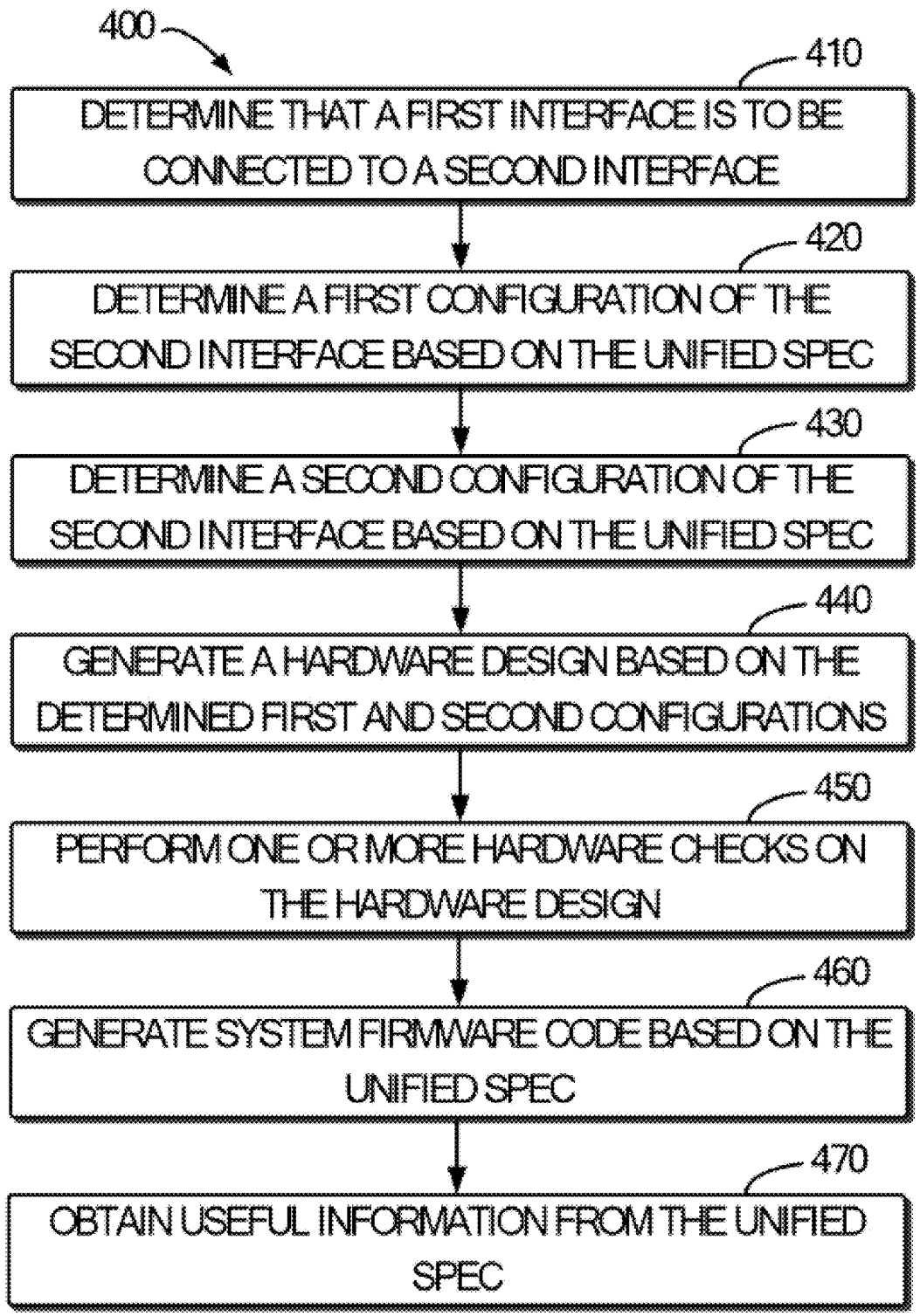
FIG. 4 is a flowchart of a method for system design based on the unified specification in accordance with embodiments of the present disclosure.

FIG. 4 shows a flowchart of a method 400 for automatic system design based on unified specification. The method 400 can be carried out by the unified design platform 300 as shown in FIG. 3. In step 410, it is determined that a first interface of a first chip is to be connected to a second interface of a second chip. The determination is made based on a system design for a system. In step 420, a first configuration of the first interface is determined based on a unified specification 210, where the unified specification 210 includes configurations of a plurality of types of chip interfaces for respective usages. In step 430, a second configuration of the second interface is determined based on the unified specification 210. It is to be understood that though step 420 is shown to be performed before step 430, it is merely for purpose of illustration. In other embodiments, step 420 may be performed after or in parallel with step 430.

In step 440, a hardware design for the system is generated at least in part based on the first and second configurations. The hardware design at least specifies a hardware-level connection between the first and second interfaces. For example, in some embodiments, a schematic for the system may be generated based on the first and second configurations, as described above. The schematic includes connections between a first plurality of pins of the first interface and a second plurality of pins of the second interface.

In some embodiments, in step 450, one or more hardware design checks may be performed on the generated hardware design based on the unified specification 210. Examples of the hardware design checks include, but are not limited to, I/O electrical check, I/O combination check, strap pin configuration check, protocol check, or the like.

In some embodiments, in step 460, the system firmware code may be generated based on the unified specification 210. For example, first built-in firmware code for the first chip and second built-in firmware code for the second chip may be obtained from the unified specification 210. The first built-in firmware code and/or the second built-in firmware code may include pseudo code. The system firmware code may be generated by integrating the first built-in firmware code and the second built-in firmware code. When executed, the system firmware may configure the system, for example, generate initialization sequence for controller.

As an example, in some embodiments, a first plurality of registers of the first interface and a second plurality of registers of the second interface involved in the connection are determined based on the unified specification 210. The first plurality of registers and the second plurality of registers may be configured based on the unified specification 210. For example, the registers may be initialized by the system firmware code generated in step 460. Of course, it is also possible to configure the registers involved in chip connections in other ways, for example, according to predetermined settings.

In some embodiments, useful information may be obtained from the unified specification 210 in step 470 to facilitate generating the hardware design and/or system firmware code. The useful information may include one or more drivers, one or more APIs, basic information such as clock frequency or base address of the system firmware code, or the like.

In addition to embodiments described above, other embodiments having fewer operational steps, more operational steps, or different operational steps are contemplated. Also, some embodiments may perform some or all of the above operational steps in a different order. The modules are listed and described illustratively according to an embodiment and are not meant to indicate necessity of a particular module or exclusivity of other potential modules (or functions/purposes as applied to a specific module).

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It is understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts/operations specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts/operations specified in the flowchart and/or block diagram block or blocks.

Embodiments according to this disclosure may be provided to end-users through a cloud-computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud-computing resources are provided to a user on a pay-per-use basis, where users are charged only for the computing resources actually used (e.g., an amount of storage space used by a user or a number of virtualized systems instantiated by the user). A user can access any of the resources that reside in the cloud at any time, and from anywhere across the Internet. In context of the present disclosure, a user may access applications or related data available in the cloud. For example, the nodes used to create a stream computing application may be virtual machines hosted by a cloud service provider. Doing so allows a user to access this information from any computing system attached to a network connected to the cloud (e.g., the Internet).

Embodiments of the present disclosure may also be delivered as part of a service engagement with a client corporation, nonprofit organization, government entity, internal organizational structure, or the like. These embodiments may include configuring a computer system to perform, and deploying software, hardware, and web services that implement, some or all of the methods described herein. These embodiments may also include analyzing the client's operations, creating recommendations responsive to the analysis, building systems that implement portions of the recommendations, integrating the systems into existing processes and infrastructure, metering use of the systems, allocating expenses to users of the systems, and billing for use of the systems.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It is also noted that each block of the block diagrams and/or flowchart illustration, and combinations of blocks in the block diagrams and/or flowchart illustration, can be implemented by special purpose hardware-based systems that perform the specified functions/acts/operations or carry out combinations of special purpose hardware and computer instructions.

While the foregoing is directed to exemplary embodiments, other and further embodiments of the disclosure may be devised without departing from the basic scope thereof, and the scope thereof is determined by the claims that follow. The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A computer-implemented method comprising:
   determining, based on a system design for a system, that a first interface of a first chip is to be connected to a second interface of a second chip;
   determining a first configuration of the first interface based on a unified specification, the unified specification at least specifying configurations of a plurality of chip interfaces for respective usages;
   determining a second configuration of the second interface based on the unified specification;
   determining a first plurality of registers of the first interface and a second plurality of registers of the second interface involved in a hardware-level connection based on the unified specification;
   configuring the first plurality of registers and the second plurality of registers based on the unified specification;
   automatically generating a hardware design for the system based on the first and second configurations, the hardware design including the hardware-level connection between the first and second interfaces; and
   automatically generating a schematic for the system based on the first and second configurations, the schematic including connections between a first plurality of pins of the first interface and a second plurality of pins of the second interface.

2. The method of claim 1, further comprising:
   performing, on the hardware design based on the unified specification, a selection which is selected from the group consisting of:
   an input/output (I/O) electrical check,
   an I/O combination check,
   a strap pin configuration check, and
   a protocol check.

3. The method of claim 1, further comprising:
   generating system firmware code based on the unified specification, the system firmware code, when executed, configuring the system.

4. The method of claim 3, wherein generating the system firmware code comprises:
   obtaining, from the unified specification, first built-in firmware code for the first chip;
   obtaining, from the unified specification, second built-in firmware code for the second chip; and
   generating the firmware code by integrating the first built-in firmware code and the second built-in firmware code.

5. The method of claim 4, wherein at least one of the first built-in firmware code and the second built-in firmware code includes pseudo code.

6. The method of claim 1, further comprising:
   obtaining, from the unified specification, for the system a selection which is selected from the group consisting of:
   a driver, and
   an application programming interface (API).

7. A device comprising:
   a processing unit;
   a memory coupled to the processing unit and storing instructions thereon, the instructions, when executed by the processing unit, performing operations including:
   determining, based on a system design for a system, that a first interface of a first chip is to be connected to a second interface of a second chip;
   determining a first configuration of the first interface based on a unified specification, the unified specification at least specifying configurations of a plurality of chip interfaces for respective usages;
   determining a second configuration of the second interface based on the unified specification;
   determining a first plurality of registers of the first interface and a second plurality of registers of the second interface involved in a hardware-level connection based on the unified specification;
   configuring the first plurality of registers and the second plurality of registers based on the unified specification;
   automatically generating a hardware design for the system based on the first and second configurations, the hardware design including the hardware-level connection between the first and second interfaces; and
   automatically generating a schematic for the system based on the first and second configurations, the schematic including connections between a first plurality of pins of the first interface and a second plurality of pins of the second interface.

8. The device of claim 7, wherein the operations further include:
   performing, on the hardware design based on the unified specification, a selection which is selected from the group consisting of:
   an input/output (I/O) electrical check,
   an I/O combination check,
   a strap pin configuration check, and
   a protocol check.

9. The device of claim 7, wherein the operations further include:
   generating system firmware code based on the unified specification, the system firmware code, when executed, configuring the system.

10. The device of claim 9, wherein generating the system firmware code comprises:
    obtaining, from the unified specification, first built-in firmware code for the first chip;
    obtaining, from the unified specification, second built-in firmware code for the second chip; and
    generating the firmware code by integrating the first built-in firmware code and the second built-in firmware code.

11. The device of claim 10, wherein at least one of the first built-in firmware code and the second built-in firmware code includes pseudo code.

12. The device of claim 7, wherein the operations further include:

obtaining, from the unified specification, for the system a selection which is selected from the group consisting of:
   a driver, and
   an application programming interface (API).

13. A computer program product being tangibly stored on a non-transient machine-readable medium and comprising machine-executable instructions, the instructions, when executed on a device, causing the device to:
   determine, based on a system design for a system, that a first interface of a first chip is to be connected to a second interface of a second chip;
   determine a first configuration of the first interface based on a unified specification, the unified specification at least specifying configurations of a plurality of chip interfaces for respective usages;
   determine a second configuration of the second interface based on the unified specification;
   determining a first plurality of registers of the first interface and a second plurality of registers of the second interface involved in a hardware-level connection based on the unified specification;
   configuring the first plurality of registers and the second plurality of registers based on the unified specification;
   automatically generate a hardware design for the system based on the first and second configurations, the hardware design including the hardware-level connection between the first and second interfaces; and
   automatically generate a schematic for the system based on the first and second configurations, the schematic including connections between a first plurality of pins of the first interface and a second plurality of pins of the second interface.

14. The computer program product of claim 13, wherein the instructions, when executed on the device, cause the device to:
   perform, on the hardware design based on the unified specification, a selection which is selected from the group consisting of:
   an input/output (I/O) electrical check,
   an I/O combination check,
   a strap pin configuration check, and
   a protocol check.

* * * * *